US012803570B2

(12) United States Patent
Man et al.

(10) Patent No.: US 12,803,570 B2
(45) Date of Patent: Nov. 17, 2026

(54) DIGITAL-TO-ANALOG CONVERSION CIRCUIT BASED ON R-2R LADDER RESISTOR NETWORK ARCHITECTURE

(71) Applicant: SG MICRO CORP, Beijing (CN)

(72) Inventors: Xuecheng Man, Beijing (CN); Yang Yang, Beijing (CN)

(73) Assignee: SG MICRO CORP, Beijing (CN)

( * ) Notice: Subject to any disclaimer, the term of this patent is extended or adjusted under 35 U.S.C. 154(b) by 112 days.

(21) Appl. No.: 19/113,932

(22) PCT Filed: Jun. 30, 2023

(86) PCT No.: PCT/CN2023/105195

§ 371 (c)(1),
(2) Date: Mar. 21, 2025

(87) PCT Pub. No.: WO2024/060781

PCT Pub. Date: Mar. 28, 2024

(65) Prior Publication Data

US 2026/0095191 A1 Apr. 2, 2026

(30) Foreign Application Priority Data

Sep. 23, 2022 (CN) ......................... 202211167626.2

(51) Int. Cl.
*H03M 1/12* (2006.01)

(52) U.S. Cl.
CPC .................................... *H03M 1/12* (2013.01)

(58) Field of Classification Search
CPC ....... H03M 1/12; H03M 1/785; H03M 1/0604
See application file for complete search history.

(56) References Cited

U.S. PATENT DOCUMENTS 4,381,495 A * 4/1983 Hotta .................. H03M 1/1071 341/122
5,455,582 A * 10/1995 Valdenaire ............ H03M 1/785 341/154

(Continued)

FOREIGN PATENT DOCUMENTS

CN 110572159 A 12/2019
CN 114297981 A 4/2022
CN 115514364 A 12/2022

*Primary Examiner* — Lam T Mai

(74) *Attorney, Agent, or Firm* — Bayramoglu Law Offices LLC

(57) ABSTRACT

The provided is a digital-to-analog conversion circuit based on an R-2R ladder resistor network architecture. The digital-to-analog conversion circuit based on an R-2R ladder resistor network architecture includes: branch resistors, branch switches, bridge resistors, a first compensation resistor, a second compensation resistor and third compensation resistors; specifically, the compensation resistors (the first compensation resistor, the second compensation resistor and the third compensation resistor) are introduced into an R-2R network in a progressive way, a Differential Nonlinearity (DNL) introduced by mismatch between the compensation resistor and on-state impedance of the branch switch may effectively attenuate due to decrease of the resistance of the compensation resistor at a higher branch, even if it may increase with increase of the resistance of the compensation resistor at a lower branch, the lower DNL may attenuate per se, so the overall DNL will decrease.

12 Claims, 3 Drawing Sheets

(56) References Cited

U.S. PATENT DOCUMENTS 5,969,658 A * 10/1999 Naylor .................... H03M 1/68
341/145
7,248,192 B2 * 7/2007 Gillespie ............. H03M 1/0607
341/120
9,276,598 B1 * 3/2016 Li ........................ H03M 1/1057
10,291,254 B2 * 5/2019 Wang ...................... H03M 1/68
10,630,303 B1 * 4/2020 Wang ...................... H03M 1/66
12,726,126 B2 * 9/2026 Tan ...................... H02M 3/1584
12,726,207 B2 * 9/2026 Deng .................... H03L 7/0997
2011/0128573 A1 * 6/2011 Ookuma ............ H04N 1/00464
358/1.15
2022/0311450 A1 * 9/2022 Wang .................... H03M 1/662
2024/0322710 A1 * 9/2024 Tan ....................... H02M 3/158
2024/0356560 A1 * 10/2024 Tan ....................... H03M 1/466
2025/0020705 A1 * 1/2025 Tan .................. G01R 19/16576
2025/0070641 A1 * 2/2025 Tan .......................... H02M 1/32
2025/0080090 A1 * 3/2025 Zhang .................... H03K 3/013
2025/0132682 A1 * 4/2025 Tan ...................... H02M 1/0845
2025/0181088 A1 * 6/2025 Yi .............................. G05F 3/26
2025/0199038 A1 * 6/2025 Tian ...................... H02M 3/158
2025/0202089 A1 * 6/2025 Li ............................. H01P 1/36
2025/0211113 A1 * 6/2025 Yi ............................ H02M 1/08
2025/0330125 A1 * 10/2025 Zhang ................... H03F 1/0216
2025/0385609 A1 * 12/2025 Yi .......................... H02M 3/158
2026/0005703 A1 * 1/2026 Yang ..................... H03M 1/785
2026/0025070 A1 * 1/2026 Fan .......................... H02M 3/07
2026/0095191 A1 * 4/2026 Man ........................ H03M 1/12
2026/0100715 A1 * 4/2026 Deng ................... H03K 3/0231
2026/0142653 A1 * 5/2026 Yi ............................ H03K 7/08
2026/0261207 A1 * 9/2026 Deng .................... H02M 3/158

* cited by examiner

DIGITAL-TO-ANALOG CONVERSION CIRCUIT BASED ON R-2R LADDER RESISTOR NETWORK ARCHITECTURE

CROSS-REFERENCE TO THE RELATED APPLICATIONS

This application is the national phase entry of International Application No. PCT/CN2023/105195, filed on Jun. 30, 2023, which is based upon and claims priority to Chinese Patent Application No. 202211167626.2, filed on Sep. 23, 2022, the entire contents of which are incorporated herein by reference.

TECHNICAL FIELD

An embodiment of the disclosure relates to the technical field of integrated circuits, in particular to a digital-to-analog conversion circuit based on an R-2R ladder resistor network architecture.

BACKGROUND

A Digital to Analog converter (DAC) has a very important function and position in the fields of communication, computers, electronic products, and the like today, which converts a digital code into an analog signal. The DAC has many different types of architectures, and among them, the DAC of an R-2R ladder resistor network architecture is a very common one. However, with the requirement of high-precision transmission relationship, the number of branches required increases correspondingly, and the size requirement (area requirement) of branch switches (generally transistors) in the branches is exponentially increased with the improvement of the precision (corresponding to the bits of the DAC) of the R-2R ladder network. This makes the layout area of the R-2R ladder network with high precision need to be very large, although in actual circuit design, it is no longer sought to increase size of the switch proportionally on a lower branch with relatively small influences, the total size of the switch required is still very large in order to ensure the requirement of precision. The larger of size of the switch is, the higher the design cost is, and the larger the matching difficulty of a device layout is.

Based on the above problems, the method of reducing the sizes of the switches of part of branches and increasing a compensation resistor to a bridge resistor between part of branches is provided to reduce the total size of the switch, reduce the design cost, and reduce the matching difficulty of the device layout. However, the inventor finds that, in the limit of a process, in this solution, when resistance changes of the branch switch and the compensation resistor are in opposite trends and the difference reaches the maximum, the problem of the maximum Differential Nonlinearity (DNL) error occurs, so that the linearity performance of a system is affected, and the yield of a product decreases.

SUMMARY

The embodiment of the disclosure provides a digital-to-analog conversion circuit based on an R-2R ladder resistor network architecture, which solves the problem of decreased product yield resulted from large DNL errors and decreased DNL performance caused by reducing of the switch size and design cost of a digital-to-analog conversion circuit based on a high-precision R-2R ladder resistor network architecture.

A first aspect of the disclosure provides a digital-to-analog conversion circuit based on an R-2R ladder resistor network architecture. The digital-to-analog conversion circuit includes branch resistors, branch switches, bridge resistors, a first compensation resistor, a second compensation resistor and third compensation resistors. The branch resistors and the branch switches are sequentially connected in series in each branch; from the lowest branch to the highest branch, one bridge resistor is bridged between each two branches, the resistance of the branch resistor is equal to twice that of the bridge resistor, and from the lowest branch to the highest branch, different digital signal bits are corresponded respectively; the first compensation resistor is serially connected to the bridge resistor between the branch of a preset bit and the lower branch adjacent to the branch of the preset bit; the second compensation resistor is serially connected to the bridge resistor between two lower branches adjacent to the branch of the preset bit in sequence; each of the bridge resistors from the branch that is two bits lower than the branch of the preset bit to the lowest branch is serially connected to one third compensation resistor, the first compensation resistor is half of the second compensation resistor, the third compensation resistor is twice of the second compensation resistor, and the resistance of the second compensation resistor is related to on-state impedance of the branch switch of the highest branch and the weight of the branch of the preset bit; the on-state impedance of the branch switch of the branch of the preset bit is twice of resistance of the second compensation resistor; the on-state impedance of the branch switch of the branch between the first compensation resistor and the second compensation resistor is three times resistance of the second compensation resistor; the on-state impedance of the branch switches of all branches, which are on the side from the branch that is two bits lower than the branch of the preset bit to the lowest branch, is equal to four times of resistance of the second compensation resistor, and the on-state impedance of the branch switch of other branches is proportional to the weight of the corresponding branch.

Optionally, the ratio of the on-state impedance of the branch switch corresponding to the highest bit to the resistance of the second compensation resistor is equal to twice of the weight of the branch of the preset bit.

Optionally, the range of the preset bit is greater than 3 and smaller than or equal to the number of bits in the digital-to-analog conversion circuit.

Optionally, the value of the preset bit is adjusted according to requirement of precision.

Optionally, the branch switch is a transistor.

Optionally, the digital-to-analog conversion circuit is a voltage-type digital-to-analog conversion circuit or a current-type digital-to-analog conversion circuit.

Optionally, one end of the branch switch of each branch from the lowest branch to the highest branch is connected with the branch resistor, and the other end is connected with high-potential reference voltage or low-potential reference voltage; and one end of the branch resistor of the highest branch is connected with one end of the corresponding branch switch, and the other end is connected with an output voltage end.

Optionally, if the low-potential reference voltage is zero reference voltage, the digital-to-analog conversion circuit is a voltage-type digital-to-analog conversion circuit with single reference voltage; and if the low-potential reference voltage is non-zero reference voltage, the digital-to-analog conversion circuit is a voltage-type digital-to-analog conversion circuit with two reference voltages.

Optionally, one end of the branch switch of each branch from the lowest branch to the highest branch is connected with the branch resistor, and the other end is connected with a current output end or a grounding end; and one end of the branch resistor of the highest branch is connected with one end of the corresponding branch switch, and the other end is connected with a reference current end.

Optionally, the value of the preset bit is adjusted according to requirement of precision includes: the higher the precision is, the larger the value of the preset bit is, and the lower the precision is, the smaller the value of the preset bit is.

Optionally, the computational formula of the resistance of the second compensation resistor is as follows, $$\Delta R2 = R_{ON}/(2 * W_{N-M}) = (1/2) * 2^{N-M} * R_{ON}$$

$\Delta R2$ is the second compensation resistor, $R_{ON}$ is on-state impedance of the branch switch corresponding to the highest bit, $W_{N-M}$ is weight corresponding to the branch of the preset bit, $W_{N-M}=½^{N-M}$, N is the number of bits in the digital-to-analog conversion circuit, and the preset bit is the (M+1)-th bit.

Optionally, that the on-state impedance of the branch switch of other branches is proportional to the weight of the corresponding branch includes:

in other branches, in the order from high bit to low bit, the on-state impedance of the switch of the branch increases as the weight of the branch decreases, the on-state impedance of the switch increases in a fixed proportion, and the fixed proportion is reciprocal to decreasing proportion of the weight of the branch.

The digital-to-analog conversion circuit based on an R-2R ladder resistor network architecture of the embodiment of the disclosure includes the branch resistors, the branch switches, the bridge resistors, the first compensation resistor, the second compensation resistor and the third compensation resistors. The branch resistors and the branch switches are sequentially connected in series to each branch; from the lowest branch to the highest branch, one bridge resistor is bridged between each two branches, the resistance of the branch resistor is equal to twice that of the bridge resistor, and from the lowest branch to the highest branch, different digital signal bits are corresponded respectively; the first compensation resistor is serially connected to the bridge resistor between the branch of a preset bit and the lower branch adjacent to the branch of the preset bit; the second compensation resistor is serially connected to the bridge resistor between two lower branches adjacent to the branch of the preset bit in sequence; each of the bridge resistors from the branch that is two bits lower than the branch of the preset bit to the lowest branch is serially connected to one third compensation resistor, the first compensation resistor is half of the second compensation resistor, the third compensation resistor is twice of the second compensation resistor, and the resistance of the second compensation resistor is related to on-state impedance of the branch switch of the highest branch and the weight of the branch of the preset bit; the on-state impedance of the branch switch of the branch of the preset bit is twice of resistance of the second compensation resistor; the on-state impedance of the branch switch of the branch between the first compensation resistor and the second compensation resistor is three times resistance of the second compensation resistor; the on-state impedance of the branch switches of all branches, which are on the side of the branch that is two bits lower than the branch of the preset bit to the lowest branch, is equal to four times of resistance of the second compensation resistor, and the on-state impedance of the branch switch of the other branches is proportional to the weight of the corresponding branch. For the digital-to-analog conversion circuit based on the R-2R ladder resistor network architecture of the embodiment of the disclosure, the compensation resistors (the first compensation resistor, the second compensation resistor and the third compensation resistor) are introduced into the R-2R network in a progressive way, the DNL introduced by mismatch between the compensation resistor and the on-state impedance of the branch switch may effectively attenuate due to decrease of the resistance of the compensation resistor at a higher branch, even if it may increase with increase of the resistance of the compensation resistor at a lower branch, the lower DNL may attenuate per se, so that the overall DNL will still decrease.

BRIEF DESCRIPTION OF THE DRAWINGS

In order to illustrate the technical solutions of the embodiments of the disclosure more clearly, the drawings of the embodiments will be simply introduced below, and it should be understood that the drawings described below are only some embodiments of the disclosure but are not intended to limit the disclosure.

Figure 1:
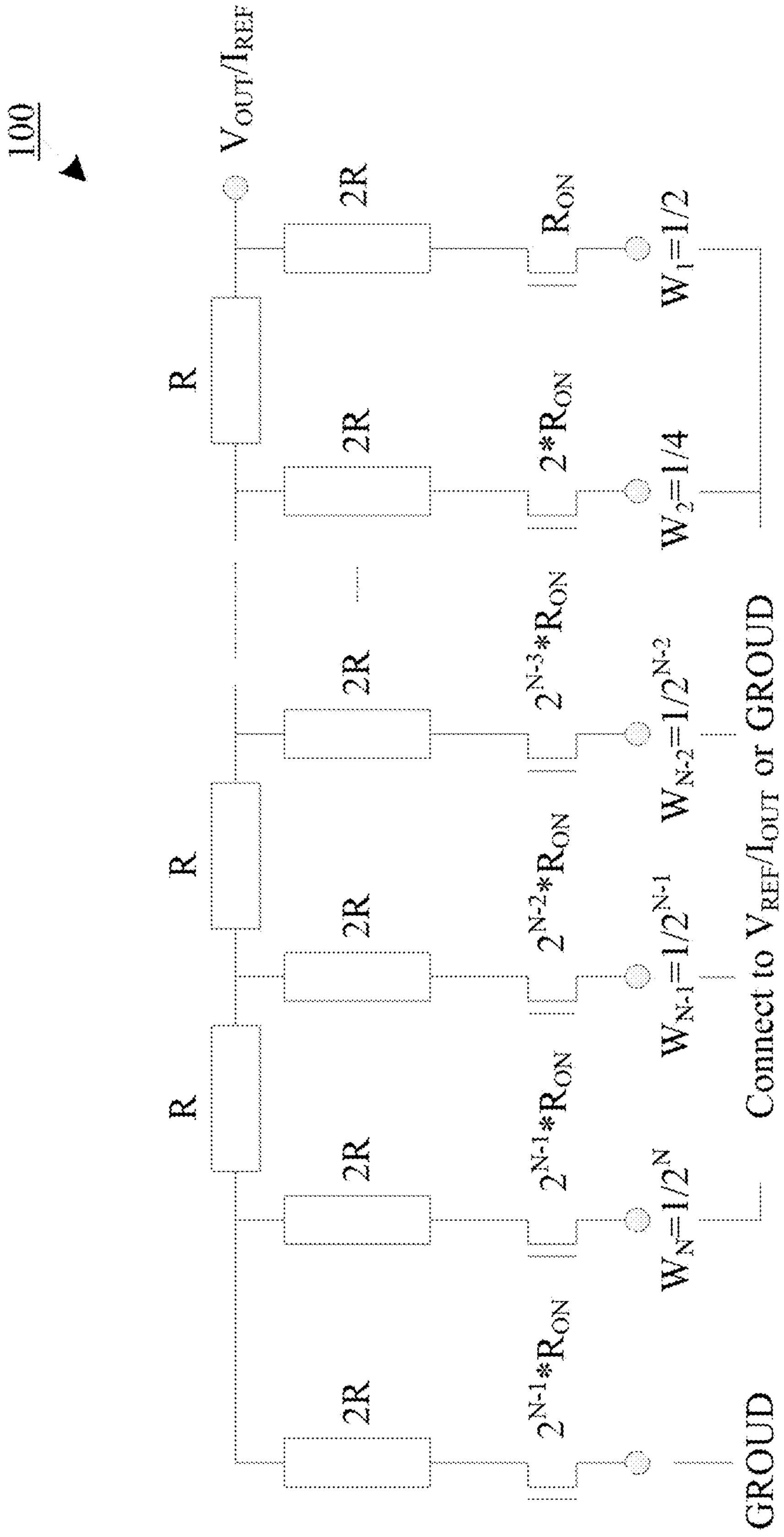
FIG. 1 (Prior Art)
FIG. 1 is a schematic network diagram of a traditional digital-to-analog conversion circuit based on an R-2R ladder resistor network architecture.

The elements in the drawings are schematic and not drawn to scale.

DETAILED DESCRIPTION OF THE EMBODIMENTS

In order to make the purposes, technical solutions and advantages of the embodiments of the disclosure clearer, the technical solutions of the embodiments of the disclosure will be described clearly and completely below in combination with the drawings. It is apparent that the described embodiments are only some rather than all embodiments of the disclosure. All other embodiments obtained by those skilled in the art based on the embodiments of the disclosure without creative efforts shall fall within the protection scope of the disclosure.

Unless defined otherwise, all terms (including technical and scientific terms) used herein have the same meaning as commonly understood by those skilled in the art to which the subject of the disclosure belongs. It should also be understood that terms defined in, for example, a general dictionary, should be understood to have the same meanings as those in the context of the specification and the relevant art, and may not be explained as idealized or too formal forms, unless otherwise specifically defined herein. As used herein, a statement “connecting” or “coupling” two or more parts together shall refer to that the parts are connected together directly or by one or more intermediate parts.

In all embodiments of the disclosure, terms such as “first” and “second” are used merely to distinguish one part (or a portion of the part) from another part (or another portion of another part).

FIG. 1 is a schematic network 100 diagram of a traditional digital-to-analog conversion circuit based on an R-2R ladder resistor network architecture. FIG. 1 illustrates a schematic diagram of a digital-to-analog conversion circuit 100 with N bits, the digital-to-analog conversion circuit based on an R-2R ladder resistor network with N bits is composed of N−1 bridge resistors R and N+1 branches, except the branch on the leftmost side, each branch has its own weight W, and when the switch of the branch is turned on, output voltage (current) of the R-2R ladder resistor network increases accordingly the voltage (current) $W^*V_{REF}$ ($W^*I_{REF}$) of the corresponding weight. Therefore, the output voltage (current) of the R-2R ladder resistor network is $\Sigma W^*V_{REF}$ ($\Sigma W^*I_{REF}$).

The R-2R ladder resistor network relies on the exact matching relationship between the bridge resistor R and the branch resistor 2R to obtain binary weighted output resistance, while on-state impedance $R_{ON}$ introduced to the branch switch belongs to a non-ideal effect, a nonlinear error will be introduced in an input and output transmission relationship of the R-2R ladder resistor network, therefore, the R-2R ladder resistor network has a feature that if the R-2R ladder resistor network needs to realize an exact transmission relationship, on-state impedance of the branch switch and the weight $W_N$ (N=1, 2 . . . . N) corresponding to the branch need to be in proportional relationship, the branch with large weight is a higher branch, and the branch with small weight is a lower branch. Specifically, the on-state impedance of the branch switch in FIG. 1 is $2^{N-1}*R_{ON}$, and the weight corresponding to the branch is $\frac{1}{2}^N$.

In a modern circuit, the branch switch is generally realized by a transistor, in such a case, the on-state impedance of the branch switch is equal to channel resistance of the transistor in a linear region, the resistance is inversely proportional to the width to length ratio of the transistor, and therefore, the branch switch with proportional on-state impedance may be obtained by adjusting the size of the transistor. When the R-2R ladder resistor network requires a high-precision transmission relationship, the number of branches required also increases accordingly. For an N-bit R-2R ladder resistor network, it can be seen from FIG. 1 that the proportion of the maximum on-state impedance to the minimum on-state impedance of the branch switch may reach 2-1 times, therefore, the size requirement (area requirement) of the branch switch also increases exponentially with improvement of the accuracy (corresponding to the bit of the digital-to-analog conversion circuit) of the R-2R ladder network. This makes that the layout area of the R-2R ladder network with high precision be very large as the size of the transistor serving as the branch switch increases, and meanwhile, matching difficulty of a device layout is improved. In actual circuit design, due to increase of bit of the high-precision DAC, the size of the switch cannot be multiplied indefinitely, therefore, proportional increase is no longer sought in match of switch resistance of the lower branch with relatively small influence, however, in order to meet precision performance, the total switch size required is still very large.

Figure 2:
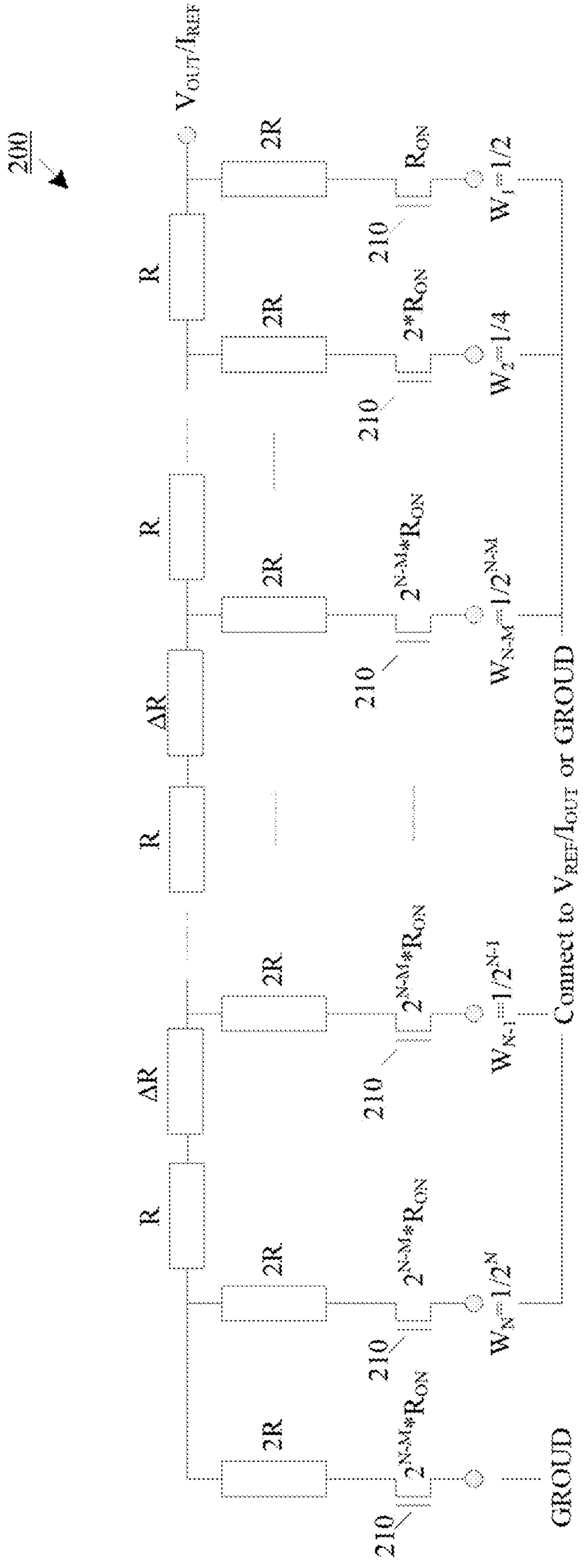
FIG. 2 is a schematic network diagram of a digital-to-analog conversion circuit based on an R-2R ladder resistor network architecture improved on FIG. 1.

Aiming at the problem the along with improvement of precision and increase of bit, the size requirement of the switch is large and the design cost is high, and the matching difficulty of a device layout increases existing in a digital-to-analog conversion circuit based on an R-2R ladder resistor network architecture in FIG. 1, an improved digital-to-analog conversion circuit 200 of an R-2R ladder resistor network architecture is provided. Specifically, as shown in FIG. 2, it includes branch resistors 2R, branch switches 210, bridge resistors R, and compensation resistors ΔR; the branch resistors 2R and the branch switches 210 are sequentially connected in series to each branch, and the branch switch 210 in the embodiment is a transistor switch, specifically may be an MOS tube, a bipolar transistor, a field effect transistor-JFET, etc.; from the lowest branch to the highest branch (the higher bit refers to large weight, and the lower bit refers to small weight, in FIG. 2, the branch with weight $W_1$ is the highest, and that with weight $W_N$ is the lowest), one bridge resistor R is bridged between each two branches, the resistance of the branch resistor 2R is equal to twice of that of the bridge resistor R, and from the lowest branch to the highest branch, different digital signal bits are corresponded respectively; one compensation resistor ΔR is serially connected to the bridge resistor R from the branch of a preset bit to the lowest branch, and the resistance of the compensation resistor ΔR is related to on-state impedance of the branch switch 210 of the highest branch and the weight of the branch of the preset bit; furthermore, the ratio of the on-state impedance of the branch switch 210 corresponding to the highest bit to the resistance of the compensation resistor ΔR is equal to twice of weight of the branch of the preset bit; illustration is made by combing with specific examples, by assuming that the preset bit is the (M+1)-th bit (numbering of bit is made with the lowest bit as the first bit and the highest bit as the Nth bit), as shown in FIG. 2, the weight corresponding the branch of the preset bit is $W_{N-M}=\frac{1}{2}^{N-M}$, by assuming that the on-state impedance of the branch switch 210 corresponding to the highest bit is $R_{ON}$, it may determine that the value of the compensation resistor ΔR is $\Delta R=(\frac{1}{2})*2^{N-M}*R_{ON}$; and the on-state impedance of the branch switches 210 of all branches, which are on the side of the branch of the preset bit to the lowest branch, is equal to preset on-state impedance, the preset on-state impedance is twice of the compensation resistor ΔR, and the on-state impedance of the branch switch 210 of other branches is proportional to the weight of the corresponding branch. Assuming the preset bit is the (M+1)-th bit, as shown in FIG. 2, for all branches from this branch (including this branch) till $W_N$, and one branch on the left of $W_N$, the resistance of all the branch switches 210 is $2*\Delta R=2^{N-M}*R_{ON}$. For other branches, namely, the branches higher than the preset bit, or the branches with weight on the right side of the $W_{N-M}$ branch, the on-state impedance of the branch switch 210 is in proportional relationship with the weight of the corresponding branch, namely, it is consistent with the relationship between the switch on-state impedance of the branch switch and the weight of the corresponding branch in FIG. 1, namely, on-state impedance of the switch increases by a multiple of 2, and the weight of the corresponding branch decreases by a multiple of 2.

In addition, it is further to be noted that the range of the preset bit in FIG. 2 is larger than 2 and small than or equal to the number of bits in the digital-to-analog conversion circuit, and in actual application, the value of the preset bit may be adjusted according to requirement of precision and design cost of the layout. Specifically, the higher the required precision is, the larger of the value of the preset bit is; the lower the required precision is, the smaller the value of the preset bit is; the lower the design cost of the layout is, the larger the value of the preset bit is; and the larger the design cost of the layout is, the smaller of the value of the preset bit is. The value of the preset bit refers to the corresponding number of bits, for example, for the 5th bit, the value of the corresponding bit is 5. From the above description, it can be seen that the proportion between the maximum on-state impedance and the minimum on-state impedance of the branch switch 210 is changed to $2^{N-M}$ times, compared with that the proportion between the maximum on-state impedance and the minimum on-state impedance of the branch switch is $2^{N-1}$ times when the digital-to-analog conversion circuit 100 of R-2R ladder resistor network architecture in FIG. 1 is adopted, the effective decrease of the total size of the branch switch is realized. Meanwhile, the weight of each branch of the improved R-2R ladder network architecture in FIG. 2 has no change compared with that of the corresponding branch in FIG. 1. To sum up, by adopting the R-2R ladder network architecture in the embodiment of the disclosure, the layout area may be greatly saved, the cost of tape-out is saved while the device matching difficulty is reduced, and meanwhile, ideal switch resistance matching may be satisfied even at a lower branch.

For the digital-to-analog conversion circuit 200 of an R-2R ladder resistor network architecture in FIG. 2, the inventor finds that the compensation resistor ΔR adopts the same type of resistor element as the bridge resistor R and the branch resistor 2R, and is a polycrystalline resistor or a metal film resistor; and the on-state impedance $R_{ON}$ of the branch switch is channel resistance of the MOS transistor when it is on, and the type is different, Therefore, by using the ΔR and $R_{ON}$, the change trend of resistance is different under different process fluctuations, temperature variations, terminal voltages and the like, ΔR is used to compensate on-state impedance of the branch switch, under a specific condition, when resistance changes of the two are in opposite change trends and the difference reaches the maximum, the maximum DNL error may be caused in the R-2R ladder resistor network.

Aiming at the problem of maximum DNL error generated in FIG. 2, the inventor has made the following analysis: the resistances of all compensation resistors are the same in FIG. 2, $\Delta R=(½)*2^{N-M}*R_{ON}$, the on-state impedance of the lower branch switch is also the same, namely, $2^{N-M}*R_{ON}$, if the on-state impedance of the compensation resistor and the switch of each branch change in the same trend, the DNL generated by the above problem will attenuate by the multiple of ½ from high bit to low bit when each branch is switched, namely, the DNL caused by the above problem achieves the maximum when the branch with the highest weight introduced at the compensation structure is switched. Based on the analysis of the feature, it is proposed to introduce the compensation resistors into the R-2R ladder resistor network, namely, the digital-to-analog conversion circuit 300 of the R-2R ladder resistor network architecture of the embodiment of the disclosure in a progressive way, then the DNL introduced by mismatch between the compensation resistor and the on-state impedance of the switch may effectively attenuate due to decrease of the resistance of the compensation resistor at a higher branch, even if it may increase with increase of the resistance of the compensation resistor at a lower branch, the lower DNL may attenuate per se, so the overall DNL will decrease, and the linearity performance is improved.

Figure 3:
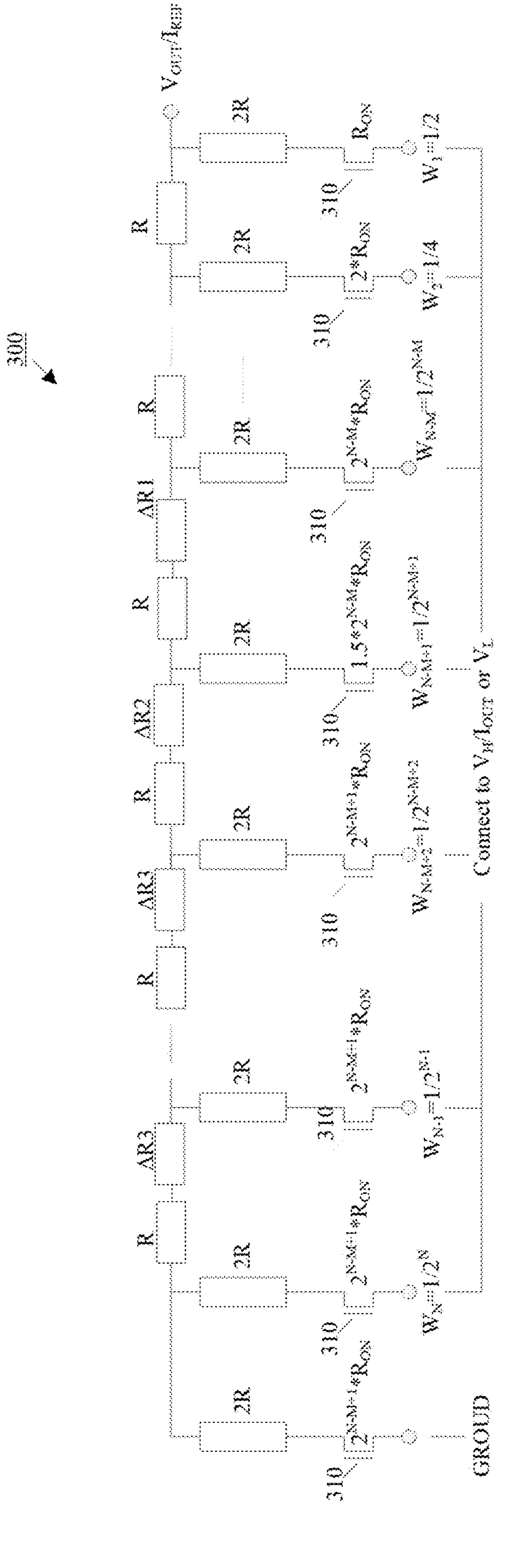
FIG. 3 is a schematic network diagram of a digital-to-analog conversion circuit based on an R-2R ladder resistor network architecture of an embodiment of the disclosure.

A detailed illustration will be made on the digital-to-analog conversion circuit 300 of the R-2R ladder resistor network architecture in the embodiment of the disclosure, and FIG. 3 is a digital-to-analog conversion circuit 300 of an R-2R ladder resistor network architecture improved on FIG. 2. It includes branch resistors 2R, branch switches 310, bridge resistors R, a first compensation resistor ΔR1, a second compensation resistor ΔR2 and third compensation resistors ΔR3; the branch resistors 2R and the branch switches 310 are sequentially connected in series in each branch, and the branch switch 310 in the embodiment of the disclosure is an MOS switch; from the lowest branch to the highest branch (the higher bit refers to large weight, the lower bit refers to small weight, in FIG. 3, the branch with weight $W_1$ is the highest, and that with weight $W_N$ is the lowest), one bridge resistor R is bridged between each two branches, the resistance of the branch resistor 2R is equal to twice of that of the bridge resistor R, and from the lowest branch to the highest branch, different digital signal bits are corresponded respectively; the first compensation resistor ΔR1 is serially connected to the bridge resistor between the branch of a preset bit and a lower branch adjacent to the branch of the preset bit; the second compensation resistor ΔR2 is serially connected to the bridge resistor between two lower branches adjacent to the branch of the preset bit in sequence; each of the bridge resistors from the branch that is two bits lower than the branch of the preset bit to the lowest branch is serially connected to one third compensation resistor ΔR3, the first compensation resistor ΔR1 is half of the second compensation resistor ΔR2, the third compensation resistor ΔR3 is twice of the second compensation resistor ΔR2, and the resistance of the second compensation resistor ΔR2 is related to on-state impedance of the branch switch 310 of the highest branch and the weight of the branch of the preset bit; furthermore, the ratio of the on-state impedance of the branch switch 310 corresponding to the highest bit to the resistance of the second compensation resistor ΔR2 is equal to twice of weight of the branch of the preset bit; illustration is made by combing with specific examples, by assuming that the preset bit is the (M+1)-th bit (numbering of bits is made with the lowest bit as the first bit and the highest bit as the N-th bit), as shown in FIG. 3, the weight corresponding the branch of the preset bit is $W_{N-M}=½^{N-M}$, by assuming that the on-state impedance of the branch switch 310 corresponding to the highest bit is $R_{ON}$, it may determine that the value of the second compensation resistor ΔR2 is $\Delta R2=R_{ON}/(2*W_{N-M})=(½)*2^{N-M}*R_{ON}$, the value of the first compensation resistor ΔR1 is $\Delta R1=(½)*\Delta R2=(¼)*2^{N-M}*R_{ON}$, and the value of the third compensation resistor ΔR3 is $\Delta R3=2*\Delta R2=2^{N-M}*R_{ON}$; the on-state impedance of the branch switch 310 of the branch of the preset bit is twice of resistance of the second compensation resistor ΔR2; the on-state impedance of the branch switch 310 of the branch (namely, the lower branch adjacent to the branch of the preset bit) between the first compensation resistor ΔR1 and the second compensation resistor ΔR2 is three times resistance of the second compensation resistor ΔR2; the on-state impedance of the branch switches 310 of all branches, which are on the side of the branch that is two bits lower than the branch of the preset bit to the lowest branch, is equal to four times the second compensation resistor ΔR2, and the on-state impedance of the branch switch 310 of other branches is proportional to the weight of the corresponding branch. By assuming that the preset bit is the (M+1)-th bit, as shown in FIG. 3, the on-state impedance of the branch switch 310 of the branch is $2*\Delta R2=2^{N-M}*R_{ON}$, the on-state impedance of the branch switch 310 of the lower branch (with weight of $W_{N-M+1}$) adjacent to the branch is $3*\Delta R2=1.5*2^{N-M}*R_{ON}$, and the on-state impedance of the branch switches 310 of all branches, which are on the side from the branch (with weight of $W_{N-M+2}$) that is two bits lower than the branch of the preset bit to the lowest branch, is $4*\Delta R2=2^{N-M+1}*R_{ON}$. For other branches, namely, the branches higher than the preset bit, or the branches with weight on the right side of the $(W_{N-M})$-th branch, the on-state impedance of the branch switch 310 is in proportional relationship with the weight of the corresponding branch, namely, it is consistent with the relationship between the switch on-state impedance of the branch switch 310 and the weight of the corresponding branch in FIG. 1. Namely, in other branches, in the order from high bit to low bit, the on-state impedance of the switch of the branch increases as the weight of the branch decreases, the on-state impedance of the switch increases in a fixed proportion, and the fixed proportion is reciprocal to decreasing proportion of the weight of the branch. Or, the lower the bit of the branch is, the smaller the weight is, and the larger the on-state impedance of the switch is; and the higher the bit of the branch is, the larger the weight is, and the smaller the on-state impedance of the switch is. Specifically, as shown in FIG. 3, the branch on the right of the preset bit is the other branch mentioned above, in the order from high bit to low bit, by comparing the on-state impedance of the switch of two adjacent branches, the increase ratio is $(2*R_{ON})/R_{ON}=2$, namely, the fixed proportion mentioned above is 2, and the fixed proportion is equal to the reciprocal of the decrease proportion ($W_2/W_1=½$) of the weight of two adjacent branches from high to low.

In addition, it is further to be noted that the range of the preset bit in FIG. 3 is larger than 3 and small than or equal to the number of bits in the digital-to-analog conversion circuit, and in actual application, the value of the preset bit may be adjusted according to requirement of precision and design cost of the layout. Specifically, the higher the required precision is, the larger the value of the preset bit is; and the lower the required precision is, the smaller the value of the preset bit is. The value of the preset bit refers to the corresponding bit, for example, for the 5th bit, the corresponding value of the bit is 5.

In order to further explain the effect of the digital-to-analog conversion circuit based on the R-2R ladder resistor network architecture in FIG. 3, a specific example is given based on FIG. 3 for explanation, assuming that the digital-to-analog conversion circuit based on the R-2R ladder resistor network architecture has 16 bits, under a certain process, when the value of resistance has no obvious fluctuation, the DNL performances of the circuits shown in FIG. 2 and FIG. 3 are equivalent; and when the resistance of the compensation resistor and the on-state impedance of the switch inversely change to the maximum due to influence of process, the DNL performance of the circuit shown in FIG. 2 deteriorates to within 0.7 LSB, and in such a case, the DNL of the circuit shown in FIG. 3 is within 0.4 LSB.

As can be seen from the specific examples described above, by adopting the digital-to-analog conversion circuit 300 of the R-2R ladder resistor network architecture in the embodiment of the disclosure, DNL may be reduced. Moreover, the weight of each branch has no change compared with that of the corresponding branch in FIG. 1, in addition, the proportion between the maximum on-state impedance and the minimum on-state impedance of the branch switch 310 is changed to $2^{N-M+1}$ times, compared with that the proportion between the maximum on-state impedance and the minimum on-state impedance of the branch switch 310 is 2-1 times when the digital-to-analog conversion circuit 100 of the R-2R ladder resistor network architecture in FIG. 1 is adopted, the effective decrease of the total size of the branch switch 310 is realized.

To sum up, for the digital-to-analog conversion circuit 300 of the R-2R ladder resistor network architecture in the embodiment of the disclosure, while layout area is saved, DNL is also reduced.

Furthermore, the digital-to-analog conversion circuit 300 of the R-2R ladder resistor network architecture in the embodiment of the disclosure is a voltage-type digital-to-analog conversion circuit or a current-type digital-to-analog conversion circuit. When it is a voltage-type digital-to-analog conversion circuit, one end of the branch switch 310 of each branch from the lowest branch to the highest branch is connected with the branch resistor 2R, and the other end is connected with high-potential reference voltage $V_H$ or low-potential reference voltage $V_L$; and one end of the branch resistor 2R of the highest branch is connected with one end of the corresponding branch switch 310, and the other end is connected with an output voltage end $V_{OUT}$. In addition, if the low-potential reference voltage $V_L$ is zero reference voltage, the digital-to-analog conversion circuit is a voltage-type digital-to-analog conversion circuit with single reference voltage; and if the low-potential reference voltage $V_L$ is non-zero reference voltage (either a positive value or a negative value), the digital-to-analog conversion circuit is a voltage-type digital-to-analog conversion circuit with two reference voltages. When it is a current-type digital-to-analog conversion circuit, one end of the branch switch 310 of each branch from the lowest branch to the highest branch is connected with the branch resistor 2R, and the other end is connected with a current output end $I_{OUT}$ or a grounding end GROUD; and one end of the branch resistor 2R of the highest branch is connected with one end of the corresponding branch switch 310, and the other end is connected with a reference current end $I_{REF}$. In addition, it is to be noted that one end of the branch switch 310 of the leftmost branch (the branch on the left side of the lowest bit) in FIG. 3 is always grounded.

In addition, for the series connection of R and ΔR1/ΔR2/ΔR3 in FIG. 3, the series connection of R and ΔR1, R and ΔR2, and R and ΔR3 may be taken as three integral resistors with resistance of R+ΔR1, R+ΔR2, and R+ΔR3 in practical application, and also may be replaced by parallel connection of 2R and 2*ΔR1, parallel connection of 2R and 2*ΔR2, and parallel connection of 2R and 2*ΔR3 to achieve the effect of resistance of R+ΔR1, R+ΔR2, and R+ΔR3, respectively.

The description and illustration of the same or corresponding modular units in the embodiments of the disclosure may be referred to one another.

In the foregoing description, well-known structural elements and steps have not been described in detail. It should be understood by those skilled in the art that the corresponding structural elements and steps may be implemented by various technical means. In addition, in order to form the same structural elements, those skilled in the art can also design a method which is not exactly the same as the method described above. In addition, although the embodiments are described separately above, this does not mean that the measures in the embodiments cannot be used advantageously in combination.

In accordance with the embodiments of the disclosure, as mentioned above, these embodiments do not elaborate in all detail or limit the disclosure to specific embodiments only. It is apparent that many modifications and variations are possible in light of the above description. These embodiments are selected and described in detail in this specification in order to better explain the principle and practical application of the disclosure, so that those skilled in the art can make good use of the disclosure and make modifications and uses based on the disclosure. The scope of protection of the disclosure shall be subject to the scope defined by the claims of the disclosure.

Unless expressly stated otherwise in the context, the singular form of the words used herein and in the attached claims includes the plural and vice versa. Thus, when referring to the singular, it usually includes the plural of the corresponding term. Similarly, the terms “contain” and “include” will be interpreted to mean inclusive rather than exclusive. Similarly, the terms “include” and “or” should be construed as inclusive unless such interpretation is expressly prohibited herein. Where the term “example” is used herein, especially when it follows a set of terms, the term “example” is merely exemplary and illustrative and should not be considered exclusive or generalized.

The further aspects and scope of adaptability will become apparent from the description provided herein. It should be understood that each aspect of the disclosure may be implemented individually or in combination with one or more other aspects. It should also be understood that the descriptions and specific embodiments herein are intended for illustrative purposes only and are not intended to limit the scope of the disclosure.

Certain embodiments of the disclosure are described in detail above, but it is apparent that those skilled in the art may make various modifications and variations of the embodiments of the disclosure without deviating from the spirit and scope of the disclosure. The scope of protection the disclosure is limited by the appended claims.

What is claimed is:

1. A digital-to-analog conversion circuit based on an R-2R ladder resistor network architecture, wherein the digital-to-analog conversion circuit comprises: branch resistors, branch switches, bridge resistors, a first compensation resistor, a second compensation resistor and third compensation resistors;

the branch resistors and the branch switches are sequentially connected in series in each branch;

from a lowest branch to a highest branch, one bridge resistor is bridged between each two branches, a resistance of the branch resistor is equal to twice a resistance of the bridge resistor, and from the lowest branch to the highest branch, different digital signal bits are corresponded respectively;

the first compensation resistor is serially connected to the bridge resistor between a branch of a preset bit and a lower branch adjacent to the branch of the preset bit; the second compensation resistor is serially connected to the bridge resistor between two lower branches adjacent to the branch of the preset bit in sequence; each of the bridge resistors from a branch that is two bits lower than the branch of the preset bit to the lowest branch is serially connected to one third compensation resistor, the first compensation resistor is half of the second compensation resistor, the third compensation resistor is twice of the second compensation resistor, and a resistance of the second compensation resistor is related to on-state impedance of the branch switch of the highest branch and a weight of the branch of the preset bit;

on-state impedance of the branch switch of the branch of the preset bit is twice the resistance of the second compensation resistor; on-state impedance of the branch switch of a branch between the first compensation resistor and the second compensation resistor is three times the resistance of the second compensation resistor; on-state impedance of the branch switches of all branches, which are on a side from a branch that is two bits lower than the branch of the preset bit to the lowest branch, is equal to four times the resistance of the second compensation resistor, and on-state impedance of the branch switch of other branches is proportional to a weight of the corresponding branch.

2. The digital-to-analog conversion circuit based on the R-2R ladder resistor network architecture according to claim 1, wherein a ratio of on-state impedance of the branch switch corresponding to a highest bit to the resistance of the second compensation resistor is equal to twice of the weight of the branch of the preset bit.

3. The digital-to-analog conversion circuit based on the R-2R ladder resistor network architecture according to claim 2, wherein a range of the preset bit is greater than 3 and smaller than or equal to a number of bits in the digital-to-analog conversion circuit.

4. The digital-to-analog conversion circuit based on the R-2R ladder resistor network architecture according to claim 3, wherein a value of the preset bit is adjusted according to requirement of precision.

5. The digital-to-analog conversion circuit based on the R-2R ladder resistor network architecture according to claim 4, wherein the branch switch is a transistor.

6. The digital-to-analog conversion circuit based on the R-2R ladder resistor network architecture according to claim 5, wherein the digital-to-analog conversion circuit is a voltage-type digital-to-analog conversion circuit or a current-type digital-to-analog conversion circuit.

7. The digital-to-analog conversion circuit based on the R-2R ladder resistor network architecture according to claim 6, wherein the digital-to-analog conversion circuit is the voltage-type digital-to-analog conversion circuit, wherein a first end of the branch switch of each branch from the lowest branch to the highest branch is connected with the branch resistor, and a second end of the branch switch of each branch from the lowest branch to the highest branch is connected with high-potential reference voltage or low-potential reference voltage; and a first end of the branch resistor of the highest branch is connected with one end of the corresponding branch switch, and a second end of the branch resistor of the highest branch is connected with an output voltage end.

8. The digital-to-analog conversion circuit based on the R-2R ladder resistor network architecture according to claim 7, wherein when the low-potential reference voltage is zero reference voltage, the digital-to-analog conversion circuit is a voltage-type digital-to-analog conversion circuit with single reference voltage;

when the low-potential reference voltage is non-zero reference voltage, the digital-to-analog conversion circuit is a voltage-type digital-to-analog conversion circuit with two reference voltages.

9. The digital-to-analog conversion circuit based on the R-2R ladder resistor network architecture according to claim 6, wherein the digital-to-analog conversion circuit is the current-type digital-to-analog conversion circuit, wherein a first end of the branch switch of each branch from the lowest branch to the highest branch is connected with the branch resistor, and a second end of the branch switch of each branch from the lowest branch to the highest branch is connected with a current output end or a grounding end; and a first end of a branch resistor of the highest branch is connected with one end of the corresponding branch switch, and a second end of the branch resistor of the highest branch is connected with a reference current end.

10. The digital-to-analog conversion circuit based on the R-2R ladder resistor network architecture according to claim 4, wherein that the value of the preset bit is adjusted according to the requirement of the precision comprises:

when the precision is higher, the value of the preset bit is larger, and when the precision is lower, the value of the preset bit is smaller.

11. The digital-to-analog conversion circuit based on the R-2R ladder resistor network architecture according to claim 2, wherein a computational formula of the resistance of the second compensation resistor is as follows, $$\Delta R2 = R_{ON}/(2 * W_{N-M}) = (1/2) * 2^{N-M} * R_{ON}$$

ΔR2 is the second compensation resistor, $R_{ON}$ is the on-state impedance of the branch switch corresponding to the highest bit, $W_{N-M}$ is the weight corresponding to the branch of the preset bit, $W_{N-M}=\frac{1}{2}^{N-M}$, N is the number of bits in the digital-to-analog conversion circuit, and the preset bit is (M+1)-th bit.

12. The digital-to-analog conversion circuit based on the R-2R ladder resistor network architecture according to claim 1, wherein that the on-state impedance of the branch switch of the other branches is proportional to the weight of the corresponding branch comprises:

in the other branches, in an order from high bit to low bit, the on-state impedance of the switch of the branch increases as the weight of the branch decreases, the on-state impedance of the switch increases in a fixed proportion, and the fixed proportion is reciprocal to decreasing proportion of the weight of the branch.

* * * * *